United States Patent

Bauman et al.

Patent Number: 5,272,768
Date of Patent: Dec. 21, 1993

[54] BLANK STRIP FONT COMPRESSION METHOD AND DEVICE, AND RESULTING STORED, DECOMPRESSIBLE FONT

[75] Inventors: Joseph H. Bauman; Claude W. Nichols, III; Mark P. Elworthy, all of Vancouver, Wash.

[73] Assignee: Hewlett-Packard Company, Palo Alto, Calif.

[21] Appl. No.: 934,288

[22] Filed: Aug. 24, 1992

Related U.S. Application Data

[63] Continuation of Ser. No. 806,802, Dec. 6, 1991, abandoned, which is a continuation of Ser. No. 493,040, Mar. 13, 1990, abandoned.

[30] Foreign Application Priority Data

Feb. 21, 1989 [JP] Japan .................................. 1-40711

[51] Int. Cl.[5] ............................................. G06K 15/00
[52] U.S. Cl. ................................... 395/110; 395/114
[58] Field of Search ............. 395/101, 110, 114, 150, 395/115; 340/731, 735, 747, 748, 750, 790, 799; 382/47, 46

[56] References Cited

U.S. PATENT DOCUMENTS

| | | | |
|---|---|---|---|
| 4,353,653 | 1/1982 | Zimmerman | 395/110 |
| 4,429,306 | 1/1984 | Macauley et al. | 395/114 |
| 4,481,602 | 11/1984 | Bohrer et al. | 364/900 |
| 4,686,525 | 8/1987 | Nagata | 395/114 |
| 4,704,040 | 11/1987 | Takano et al. | 395/114 |
| 4,735,515 | 4/1988 | Ueda et al. | 395/114 |
| 4,740,783 | 4/1988 | Lawrence et al. | 395/114 |
| 4,749,989 | 6/1988 | Carosso | 395/114 |
| 4,881,069 | 11/1989 | Kameda et al. | 340/735 |
| 4,918,429 | 4/1990 | Clarke | 395/114 |

FOREIGN PATENT DOCUMENTS 2100093 4/1990 Japan .................................. 395/114

*Primary Examiner*—Arthur G. Evans

[57] ABSTRACT

The invented blank strip compression method recognizes that different font characters may have strips of blank data. For example, in the character "_" the blank space above the character itself does not need to be stored in memory. The method identifies strips of blank and non-blank bit images that define characters and saves in memory only the bit images that are within the strips that include non-blank bit images resulting in a stored, decompressible font.

7 Claims, 7 Drawing Sheets

```
Address  Contents         Description
(Hex)    (Hex)
-----------------------------------------------------------------
                          BLACK WIDTH TABLE
0000     07                 "]"
0001     07                 "i"
0002     18                 " "

NON-BLANK-STRIP TABLE
                            A one indicates that the corresponding strip has
                            dots to print. A zero indicates no dots to print.
                            Bits 7 - 3 -- Unused strips. these bits must be 0
                            Bit 2      -- Strip 3
                            Bit 1      -- Strip 2
                            Bit 0      -- Strip 1 (least significant bit)
0003     06                 "]"
0004     02                 "i"
0005     01                 " "

FLAG BYTE POINTER TABLE (Strip 3)
0006     001E               "]"
0008     0027               "i"
000A     0027               " "
000C     0027               Pointer to the "virtual" character after "_"
                          FLAG BYTE POINTER TABLE (Strip 2)
000E     0027               "]"
0010     0036               "i"
0012     0046               " "
0014     0046               Pointer to the "virtual" character after "_"
                          FLAG BYTE POINTER TABLE (Strip 1)
0016     0046               "]"
0018     0046               "i"
001A     0046               " "
001C     0076               Pointer to the "virtual" character after "_"
                          FLAG BYTES and DOT DATA (Strip 3)
                            "]"
001E     00,00,01,01,00,    Flag Bytes
         00,00
0025     80,FF              Dot Data
                            "i"
0027                        NO Flag Bytes
                            " "
0027                        NO Flag Bytes
                          FLAG BYTES and DOT DATA (Strip 2)
                            "]"
0027     01,01,01,03,01,    Flag Bytes
         01,01
002E     01,01,01,FF,FF,    Dot Data
         01,01,01
                            "i"
0036     01,01,03,03,01,    Flag Bytes
         01,01
003D     01,01,10,01,9F,    Dot Data
         FF,01,01,01
                            " "
0046                        NO Flag Bytes
                          FLAG BYTES and DOT DATA (Strip 1)
                            "]"
0046                        NO Flag Bytes
                            "i"
0046                        NO Flag Bytes
                            " "
0046     02,02,02,02,02,    Flag Bytes
         02,02,02,02,02,
         02,02,02,02,02,
         02,02,02,02,02,
         02,02,02,02
005E     20,20,20,20,20,    Dot Data
         20,20,20,20,20,
         20,20,20,20,20,
         20,20,20,20,20,
         20,20,20,20
0076                        Next address
```

Fig. 4

```
0000000        0000000        000000000000000000000000
0000000        0000000        000000000000000000000000
0000000        0000000        000000000000000000000000
0000000        0000000        000000000000000000000000
0000000        0000000        000000000000000000000000
0000000        0000000        000000000000000000000000
0000000        0000000        000000000000000000000000    Strip 3
0000000        0000000        000000000000000000000000
0011000        0000000        000000000000000000000000
0001000        0000000        000000000000000000000000
0001000        0000000        000000000000000000000000
0001000        0000000        000000000000000000000000
0001000        0000000        000000000000000000000000
0001000        0000000        000000000000000000000000
0001000        0000000        000000000000000000000000
0001000        0000000        000000000000000000000000

0001000        0001000        000000000000000000000000
0001000        0000000        000000000000000000000000
0001000        0000000        000000000000000000000000
0001000        0011000        000000000000000000000000
0001000        0001000        000000000000000000000000
0001000        0001000        000000000000000000000000
0001000        0001000        000000000000000000000000    Strip 2
0001000        0001000        000000000000000000000000
0001000        0001000        000000000000000000000000
0001000        0001000        000000000000000000000000
0001000        0001000        000000000000000000000000
0001000        0001000        000000000000000000000000
0001000        0001000        000000000000000000000000
0001000        0001000        000000000000000000000000
0001000        0001000        000000000000000000000000
1111111        1111111        000000000000000000000000

0000000        0000000        000000000000000000000000
0000000        0000000        000000000000000000000000
0000000        0000000        111111111111111111111111
0000000        0000000        000000000000000000000000
0000000        0000000        000000000000000000000000
0000000        0000000        000000000000000000000000
0000000        0000000        000000000000000000000000    Strip 1
0000000        0000000        000000000000000000000000
0000000        0000000        000000000000000000000000
0000000        0000000        000000000000000000000000
0000000        0000000        000000000000000000000000
0000000        0000000        000000000000000000000000
0000000        0000000        000000000000000000000000
0000000        0000000        000000000000000000000000
0000000        0000000        000000000000000000000000
0000000        0000000        000000000000000000000000
```

```
0000000         -------         ------------------------
0000000         -------         ------------------------
0000000         -------         ------------------------
0000000         -------         ------------------------
0000000         -------         ------------------------
0000000         -------         ------------------------
0000000         -------         ------------------------  Flag Bytes
0011000         -------         ------------------------
-------         -------         ------------------------
-------         -------         ------------------------
-------         -------         ------------------------
-------         -------         ------------------------
-------         -------         ------------------------   Strip 3
-------         -------         ------------------------
-------         -------         ------------------------
--11---         -------         ------------------------
--01---         -------         ------------------------
--01---         -------         ------------------------
--01---         -------         ------------------------
--01---         -------         ------------------------
--01---         -------         ------------------------
--01---         -------         ------------------------
--01---         -------         ------------------------
0000000         0000000         ------------------------
0000000         0000000         ------------------------
0000000         0000000         ------------------------
0000000         0000000         ------------------------
0000000         0000000         ------------------------
0000000         0000000         ------------------------
0001000         0011000         ------------------------  Flag Bytes
1111111         1111111         ------------------------
---1---         --01---         ------------------------
---1---         --00---         ------------------------
---1---         --00---         ------------------------
---1---         --11---         ------------------------
---1---         --01---         ------------------------
---1---         --01---         ------------------------
---1---         --01---         ------------------------  Strip 2
---1---         --01---         ------------------------
---1---         --01---         ------------------------
0001000         0001000         ------------------------
0001000         0001000         ------------------------
0001000         0001000         ------------------------
0001000         0001000         ------------------------
0001000         0001000         ------------------------
0001000         0001000         ------------------------
0001000         0001000         ------------------------
1111111         1111111         ------------------------
-------         -------         000000000000000000000000
-------         -------         000000000000000000000000
-------         -------         000000000000000000000000
-------         -------         000000000000000000000000
-------         -------         000000000000000000000000
-------         -------         000000000000000000000000
-------         -------         111111111111111111111111
-------         -------         000000000000000000000000  Flag Bytes
-------         -------         000000000000000000000000
-------         -------         000000000000000000000000
-------         -------         111111111111111111111111
-------         -------         000000000000000000000000
-------         -------         000000000000000000000000
-------         -------         000000000000000000000000  Strip 1
-------         -------         000000000000000000000000
-------         -------         000000000000000000000000
-------         -------         ------------------------
-------         -------         ------------------------
-------         -------         ------------------------
-------         -------         ------------------------
-------         -------         ------------------------
-------         -------         ------------------------
-------         -------         ------------------------
```

Fig. 7

BLANK STRIP FONT COMPRESSION METHOD AND DEVICE, AND RESULTING STORED, DECOMPRESSIBLE FONT

CROSS REFERENCE TO RELATED APPLICATIONS

This is a continuation of co-pending application Ser. No. 07/806,802 filed on Dec. 6, 1991, now abandoned, which in turn was a continuation of application Ser. No. 07/493,040 filed on Mar. 13, 1990, now abandoned.

TECHNICAL FIELD

This invention relates to data compression, and, more particularly, to a method and device for compressing font data by identifying strips of blank data, and to a resulting stored, decompressible font.

BACKGROUND ART

A font is a family of characters of a given style, typically used in printing. A font character is one symbol in the font.

In computer printing systems, fonts are often stored in a printer's memory and accessed by commands from a host computer. The more characters in the font, the more memory that is needed.

Often users desire to print with more than one font. For example, a user may wish to italicize a word, or to use smaller letters. The italicized and small characters would constitute different fonts. Courier 12-point is a particular font. The word "point" refers to a unit of type measurement equal to 1/72-of-an-inch, so "12-point" refers to characters that are 1/6-of-an-inch tall. Courier 12-point italic and Courier 10-point are both different fonts, one having italicized characters and the other having smaller characters.

Additional memory is needed to store additional fonts in a printer, such as italicized fonts and small character fonts. But memory is expensive, so printers with multiple fonts are also expensive.

The invention compresses more fonts into a fixed-size memory. Thus, multiple fonts may be used with a smaller memory.

DISCLOSURE OF THE INVENTION

The invented blank strip compression method, device and font recognize that different font characters may have strips of blank data. For example, in the character "_" the blank space above character itself does not need to be stored in memory. The invention identifies strips of blank and non-blank bit images that define characters and saves in memory only the bit images that are within the strips that include non-blank bit images.

BRIEF DESCRIPTION OF THE DRAWINGS

FIG. 4 is a font storage listing for the upright font of FIG. 1.

FIG. 5 shows dot patterns, similar to that of FIG. 1, that have been compressed by defining character widths.

FIG. 6 shows dot patterns, similar to FIG. 5, that have been further compressed by using flag bytes to represent blank bits.

FIG. 7 shows dot patterns, similar to FIG. 6, that have been compressed by using the invented blank strip compression method.

DETAILED DESCRIPTION AND BEST MODE FOR CARRYING OUT THE INVENTION

To store fonts in memory, characters (or font units) are digitized into dots, and placed on a matrix or field at a given resolution. A dot is simply part of a character.

Figure 1:
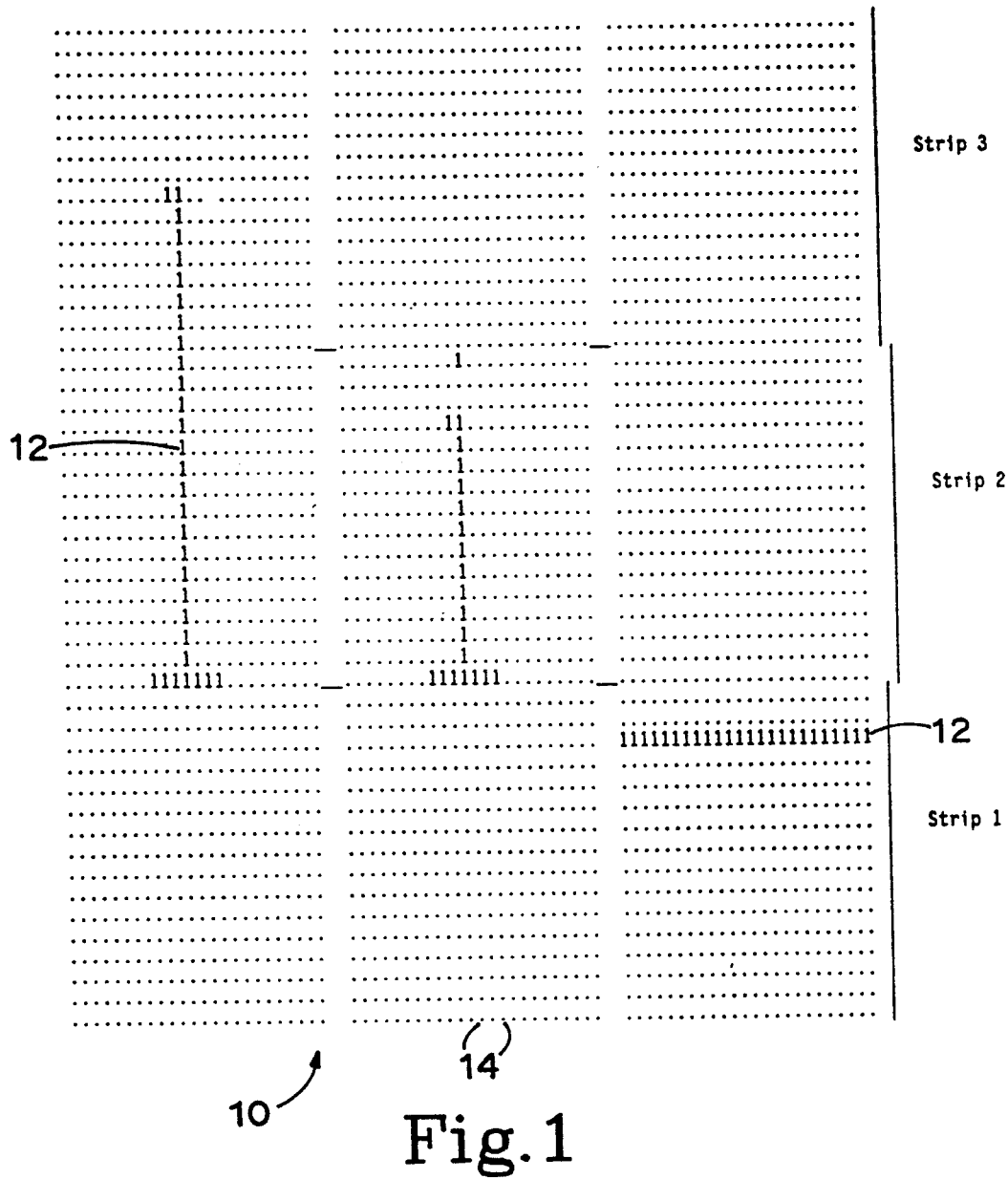
FIG. 1 shows dot patterns of a font composed of three upright characters: "1", "i", and "_".

FIG. 1 shows generally at 10 the dot patterns of a font composed of three characters, "1", "i" and "_". These patterns have been drawn as such would exist for a scanning printhead ink jet printer. An ink jet printer prints by shooting drops of ink onto a page. In FIG. 1, the three characters are made from an arrangement of "1s", such as those identified at 12. The "1s" represent dots of ink and may be thought of as print-visible, or non-blank, elements. The data defining these characters may be called font data.

Surrounding the characters are numerous points, such as points 14. They represent spaces that are blank, but that could be occupied by an ink drop, and they may be thought of as print-invisible elements. Both the blank and non-blank elements may be referred to as print-effecting elements.

The characters of FIG. 1 are depicted in a bit image format. In other words, the patterns in this figure may be stored in the memory of a printer in such a way that each available space for a drop of ink may be represented by a bit of information. A bit, or binary digit, is the basic unit of information in a computer, and may be either "1" or "0". If the bit is 1, it may be thought of as "on", and an ink drop will be printed in the corresponding location. If the bit is 0, it is "off" and no ink drop will be printed. "1s", such as those identified at 12, may also be thought of as bits that are on. Points, such as points 14, may also be thought of as bits that are off. Thus, the dot patterns of FIG. 1 may also be referred to as bit patterns, and the "1s" and points may be referred to as bit images.

Scanning ink jet printers have printheads with limited vertical dimensions or printhead heights. For example, if a printhead is 1/6-of-an-inch high, it can only print characters or parts of characters that are 1/6-of-an-inch high or less in a single pass of the printhead.

This often results in two-pass characters, or characters that can only be printed in two passes of a printhead. To illustrate this, FIG. 1 has been divided into three strips, strip 1, strip 2 and strip 3. Each strip is a horizontal row of character data. The direction of the strip may be thought of as a horizontal axis for the field of character data.

In FIG. 1, each strip is 16-bits high, or 2-bytes high, where a byte is eight bits. The direction of the strip's height may be thought of as a vertical axis for the field of character data. In other words, each strip may contain a number of 2-byte columns of information. The vertical height of the strips represents the vertical height of a given printhead, so each strip would be printed in a different pass of the printhead.

The character "1" in FIG. 1 is 24-bits high, and therefore, is a 2-pass or 2-strip character. The remaining characters, "i" and "_", are single-pass or single-strip characters. The vertical dimension of the characters may be referred to as the character's height aspect, and may be defined by strips. Additionally, the characters of FIG. 1 have been defined so that they may have a maximum horizontal dimension, or width value, of 24-bits. The memory required to store the raw data depicted in FIG. 1 may be calculated as follows:

$$
\begin{aligned}
\text{Memory required} &= \text{(bytes per column)} \times \\
&\quad \text{(columns per character)} \times \\
&\quad \text{(number of characters)} \\
&= 6 \times 24 \times 3 \\
&= 432\text{-bytes}
\end{aligned}
$$

Strip 3, shown in FIG. 1, is necessary for uppercase and tall characters, such as "1". Strip 2 is required for lowercase characters, as well as for uppercase and tall characters. Strip 1 is required for letters such as "g", and for units such as "_" that drop below other characters. The amount of memory required to store the font of FIG. 1 may be decreased or compressed by recognizing that not all characters include non-blank portions in each strip. For example, the "1" character does not include a non-blank portion in strip 1. The "i" character does not include non-blank portions in strips 1 or 3, and the "_" character does not include non-blank portions in strips 2 and 3. The invented method recognizes the blank areas, and only stores in memory the strip portions having non-blank bit images.

Figure 2:
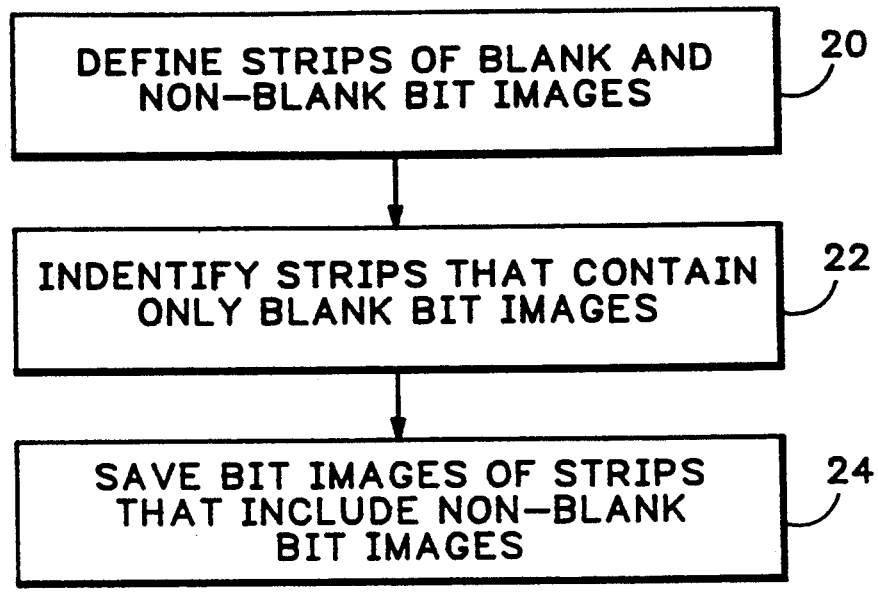
FIG. 2 is a simple block diagram showing how font character data may be compressed according to the invented method.
Figure 2A:
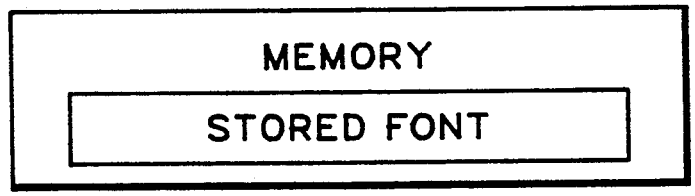
FIG. 2A is a block/schematic diagram showing a compressed, decompressible font stored in the memory of an electronic device, such as a printer.

FIG. 2 is a simple block diagram illustrating the invented method. First, characters must be defined in strips of blank and non-blank bit images, such as shown in box 20. The method then identifies those strips that contain only blank bit images, as shown in box 22. Only the bit images in strips that include non-blank bit images are saved in memory, as shown in box 24. The resulting font is stored in memory and depicted in FIG. 2A.

Figure 3:
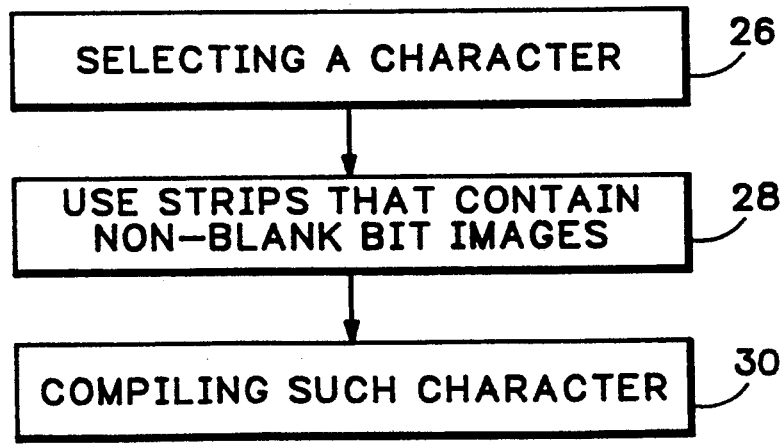
FIG. 3 is a simple block diagram showing how font character data may be decompressed according to the invented method.

FIG. 3 is a block diagram depicting how the fonts compressed according to the invented method may be decompressed. First, a character is selected at box 26. Then the decompression method uses the strips defining the selected character that contain non-blank bit images, as represented by box 28, to compile the character from stored data, as shown in box 30.

FIG. 4 is a storage listing of the font of FIG. 1. The storage listing includes three columns, an address column, a contents column, and a description column. The address specifies the beginning location in memory of the item listed in the description column. The contents column lists the actual data for the item described, and begins with the address listed. The addresses and contents listed in FIG. 4 are hexadecimal numbers. Hereinafter, the addresses in FIG. 4 will be used as line references.

Addresses "0000", "0001" and "0002" contain "Black Width Table" information. That table simply defines the actual width or width aspect, of the characters in the font, so that blank bits do not need to be stored in memory. For example, address "0000" defines the width of the character "1" as "07". In other words, the width of that character is seven bits. When the character is printed, the seven bits will correspond to seven ink dots. As stated earlier when discussing FIG. 1, the possible width of the character is 24-bits. Thus, identifying the width of the "1" means that seventeen blank bit columns do not need to be stored in memory. Similarly, the "i" character is seven bits wide and the "_" is 24-bits wide (in FIG. 4, the width of the "_" character is expressed as 18 hexadecimal, which equals 24 decimal). The resulting font dot patterns are shown in FIG. 5, with the font of FIG. 1 shown compressed generally at 40. In FIG. 5, the dot patterns are expressed in "1s" and "0s", rather than "1s" and "points", to show the actual bit information that would be stored. The "0s" in FIG. 5 correspond to the points in FIG. 1. The memory required to store the data shown in FIG. 5 is:

$$
\begin{aligned}
\text{Memory required} &= ((\text{bytes per column}) \times (\text{sum of number of} \\
&\quad \text{columns for all characters})) + \\
&\quad (\text{number of bytes in Black Width Table,} \\
&\quad \text{one per character}) \\
&= 6 \times (7 + 7 + 24)) + 6 \\
&= 234\text{-bytes}
\end{aligned}
$$

Returning to FIG. 4, address locations "0006" through "000C" identify the location of the "Flag Byte Pointer Table" for strip 3 of the font depicted in FIG. 1. Flag bytes are bytes of information used to represent other bytes of information. The Flag Byte Pointer Table is a table of data that "points" to the actual flag bytes. By using flag bytes, data defining the characters of FIG. 1 can be further compressed. For example, strip 3 of FIG. 1 includes 72-columns of data. Those columns are divided into groups of 24. Specifically, the first 24-columns of strip 3 are used to define the upper portion of the character "1". The second group of 24-columns would be used to define the upper portion of the character "i", if that character was taller. Similarly, the third group of 24-columns would be used to described the "_" character if necessary.

Figure 6:
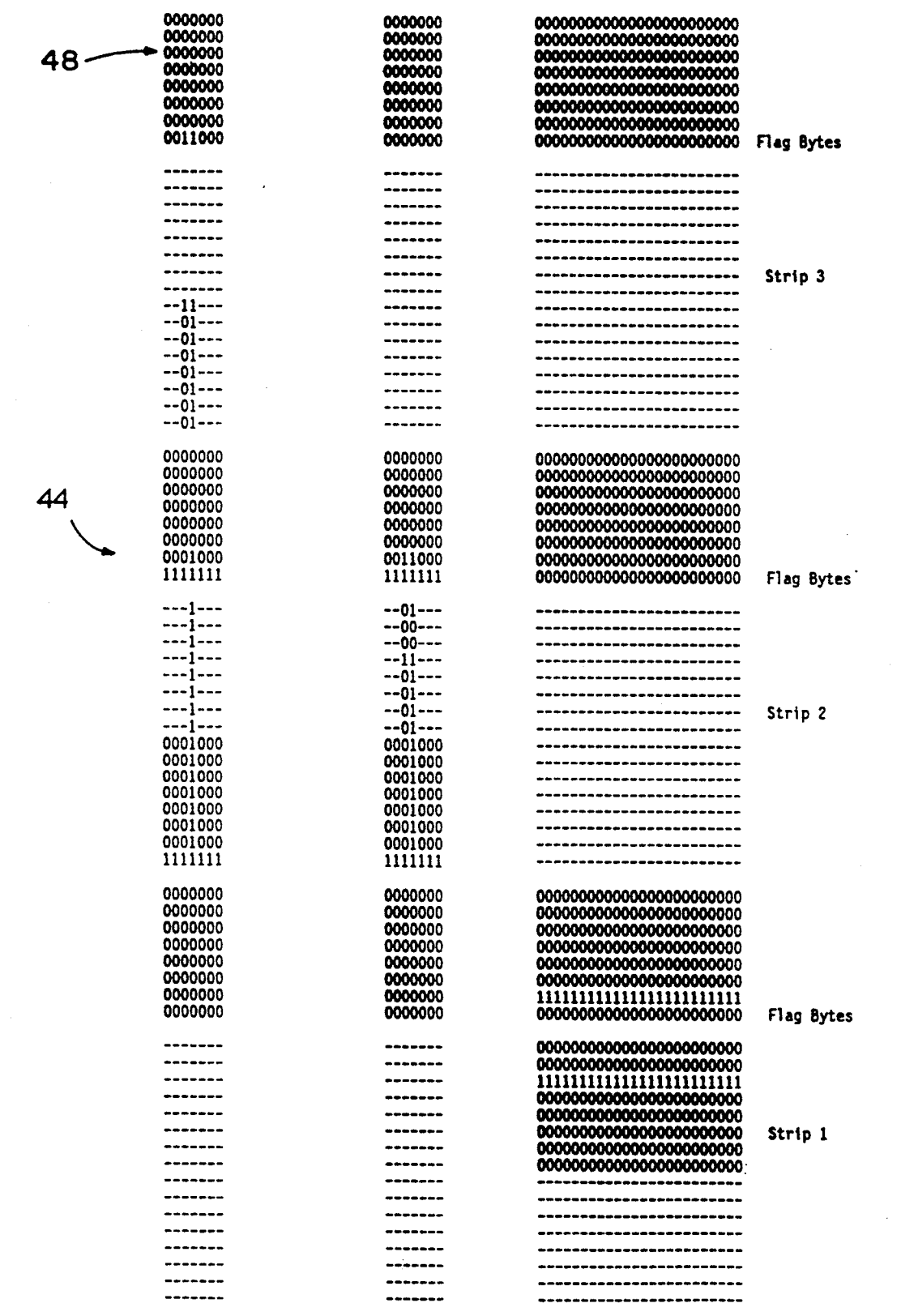

The compression achieved using flag bytes is shown in FIG. 6. FIG. 6 is a dot pattern similar to FIGS. 1 and 5, except that flag bytes have been used to represent blank columns in the strips. In FIG. 6, the font of FIG. 1 is shown generally at 44, and the flag bytes for strip 3 are shown generally at 48. Each flag byte is a vertically oriented byte of information. The bottom two bits in each flag byte indicate whether the bit column or dot data immediately below it has any bits that are "1" or on. If not, the bit column is not saved, rather it is represented by the flag byte. Each bit of the flag byte corresponds to one byte of the bit column. The flag byte's least significant bit, or bottom bit, represents the bottom byte of the bit column. The flag byte's second bit from the bottom represents the top byte of the bit column. If either of those two flag byte bits are 1, there is dot data in the respective byte of the bit column. In FIG. 6, the top six bits of the flag bytes are not used. If the bit columns in the dot pattern strips were taller, more flag byte bits could be used. The term "flag" may be used to refer to any means for representing blank information, such as the flag bytes described above.

The dashes in FIG. 6 indicate bits of information that do not need to be saved. Some bits with zero values are still saved because typically bits are grouped into bytes, and computing systems often work with bytes.

The memory required to store the data of FIG. 6 is:

```
Memory required  =  (number of flag bytes) +
                    (strip 3 bytes) +
                    (strip 2 bytes) + (strip 1 bytes) +
                    (number of bytes in Black
                    Width Table) +
                    (number of bytes required for Flag
                    Byte Pointer Tables)
                 =  ((7 + 7 + 24) × 3) + 2 + 17 +
                    24 + 3 + 24
                 =  184-bytes
```

Turning back to FIG. 4, addresses "000E" through "0014" identify the location of the Flag Byte Pointer Table for strip 2, and addresses "0016" through "001C" identify the Flag Byte Pointer Table for strip 1. The actual flag bytes and the dot data for strip 3 is addressed at "001E" through "0025". The flag bytes and dot data for strip 2 are addressed at "0027" through "003D", and the flag bytes and dot data for strip 1 are addressed at "0046" through "005E".

Also in FIG. 4 address locations "000C", "0014", and "001C" identify pointers to virtual characters. The virtual characters are simply the ends of the preceding data. Thus, these pointers, in essence, identify the end of the character portions in the respective strips. By identifying the ends, bidirectional printing may be employed. For example, address location "0076", described as "Next address" identifies the end of the dot data defining the portion of the "_" character in strip 1.

Address locations "0003" through "0005" describe what is referred to as the "Blank Strip Table". That table indicates which strips contain non-blank character data. In other words, that table identifies whether part of a character is in strip 1, strip 2, strip 3 or any combination of the strips. For example, address location "0003" contains "06" in hexadecimal which identifies the strips containing parts of the character "1". The hexadecimal "06" may be written in binary as "00000110". In that binary number, the least significant bit, or the right-most bit, which may be referred to as bit zero, contains the value "0". The two bits immediately to the left of the least significant bit, or bits 1 and 2, counting from right to left from bit zero, both contain the value "1". The remaining five bits all contain "0".

The location of the "1s" in the binary number stored at address location "0003" identifies which strips of the character "1" contain non-blank character data. Bit 2 in that number refers to strip 3, bit 1 refers to strip 2, and bit 0 refers to strip 1. The remaining five bits are unused because the font shown in FIG. 1 contains only three strip characters. Accordingly, only three bits are needed to refer to the strips. If the character was a four strip character, then four bits would be used; five bits would be used for five strip characters, and so on.

A "1" in bit 2 means that strip 3 includes non-blank character data. A "1" in bit 1 means that there is non-blank character data in strip 2, and a "1" in bit 0 means that there is non-blank character data in strip 1. Returning now to the character "1", the contents of address location "0003" is, again, "00000110". Thus, strips 2 and 3 contain non-blank character data, but strip 1 does not. Similarly, address "0004" describes the character "i" and contains the hexadecimal number "02", which may be written in binary as "00000010". That binary number indicates that the "i" character only has non-blank character data in strip 2. Address location "0005" refers to the "_" character and contains the hexadecimal number "01", which may be written in binary as "00000001", meaning that only strip 1 contains non-blank character data for the "_" character.

When character "1" is selected for use, the method determines the width of the character, then the "Blank Strip Table" is reviewed to see which strips contain a portion of the character. Address location "0003" indicates that strips 3 and 2 contain non-blank character data. Address "0006" points to "001E" as the location of the flag bytes for the portion of the "1" character in strip 3. Address location "001E" lists the flag bytes for the strip 3 portion of the character as "00, 00, 01, 01, 00, 00, 00". There are seven flag bytes because the "1" character is seven bits wide. Again, each byte is expressed as a hexadecimal number and represents a vertical column of 16-bits. The first two flag bytes "00" and "00" each represent a vertical column of "0000000000000000", and they mean that there is no dot data in the first two columns of the character "1" in strip 3. The next two flag bytes "01" and "01" mean that there is dot data in the bottom byte of information in the respective two columns. The flag byte "01" may be expressed in binary as "00000001". The remaining three flag bytes indicate that there is no dot data in strip 3 in the last three columns for the character. Immediately thereafter, at address location "0025", the actual dot data is stored for the two columns having dot data. The first dot data is listed as "80" in hexadecimal. Converting the hexadecimal "80" to binary equals "10000000". The one represents a dot to be printed by the printer. The entire eight digits represent the bottom eight bits of the appropriate 16-bit column in strip 3. The dot data "FF" in hexadecimal equals "11111111" in binary. That corresponds to the bottom eight bits of the appropriate 16-bit column in strip 3.

The method then moves to address location "000E" to point to the flag bytes in strip 2 that contain a portion of the character "1". The "000E" address points to or contains the "0027" address. The "0027" address contains the flag bytes for the portion of the "1" character in strip 2, immediately followed by the appropriate dot data beginning at address location "00E". The flag bytes and dot data at those locations are similar to the flag bytes and dot data described previously as existing in strip 3. The method does not go to the strip 1 Flag Byte Pointer Table because it knows that strip 1 does not contain any non-blank character data for the "1" character.

Similarly, if the character "i" is selected, address "0004" contains the hexadecimal "02" which indicates that only strip 2 contains non-blank character data. Accordingly, the method refers to address "0010" which contains the flag byte pointer for the "i" character, which is "0036". The actual flag bytes are found at address "0036" and the actual dot data follows the flag bytes at address "003D".

If the "_" character is selected, address "0005" contains the hexadecimal number "01" which indicates that only strip 1 contains non-blank character data. That data is accessed as described above.

By using the "Blank Strip Table", the invented method is able to limit the amount of data that must be stored to describe certain characters. The amount of data needed to describe the characters shown in FIG. 1, using the invented method, is shown in FIG. 7. As can be seen, strip 3 does not contain any data for the characters "i" and "_". Strip 2 does not contain any data for the "_" character, and strip 1 does not contain any data for the "1" and "i" characters. The memory required to store the information shown in FIG. 7 is:

```
Memory required  =  (number of flag bytes) +
                    (strip 3 bytes) +
                    (strip 2 bytes) + (strip 1 bytes) +
                    (number of bytes in Black
                    Width Table) +
                    (number of bytes required for Flag
                    Byte Pointer Tables) +
                    (number of bytes required
                    for the Blank Strip Table)
                 =  45 + 2 + 17 + 24 + 3 + 24 + 3
                 =  118-bytes
```

The invention may also be described as compressing font data, where the data is characterized by a field including both print-visible and print-invisible elements. The field is simply the matrix or dot pattern for the characters of the font. The invention examines the font's characters, and identifies what may be thought of as subfields. The subfields may be the parts of the matrix or dot patterns where actual character portions exist, and the subfields may be defined by generally vertical and generally horizontal axes which correspond to a character's height and width, respectively. The invention determines whether the subfields contain or lack print-visible elements, and only, stores the print-visible and print-invisible elements in the subfields containing print-visible elements.

In this manner, the invention increases the font-text printing throughput of a printer, or the speed at which a printer prints text, by establishing in memory a font-data library, or collection of font characters, compressed to include only boundary-limited font-data subfields which contain print-visible elements. Boundary-limited font-data subfields refers to subfields with limited horizontal and vertical boundaries. During a printing operation, one of the subfields may be accessed and printed.

From yet another perspective, the invention may be thought of as examining a field of print-visible and print-invisible elements, and compressing the field by identifying the disposition of print-visible elements, or in other words, the existence or absence of print-visible elements, and their locations. The invention then effectively shrinks the field vertically and horizontally to a subfield having boundaries that closely encompass the identified print-visible elements. In this manner, the invention may store only print-effecting data for each subfield.

Figure 8:
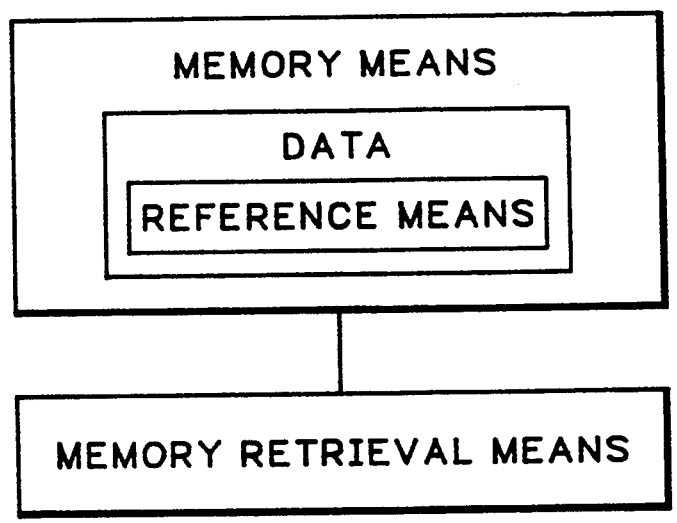
FIG. 8 is a block/schematic diagram of an electronic device employing the invented method and resulting font.

The invented method and resulting font will typically be used in electronic devices such as printers. FIG. 8 is a block/schematic diagram of an electronic device employing the invented method and resulting font. In such a case, the font will be stored in memory means such as memory chips. Reference means, such as the "Blank-Strip Table" described above, will be included within the font for signaling strips that include non-blank bit images. Additionally, the electronic device will include memory retrieval means, such as disk drives and read-/write heads, associated with the memory for accessing the font.

Industrial Applicability

The invented method is applicable to situations where multiple fonts are to be saved in limited memory, such as in computer printers.

While the best mode and preferred embodiment of the invention have been described, variations and changes may be made without departing from the spirit of the invention.

What is claimed is:

1. A method of compressing data, where the data includes blank and non-blank bit images that describe a character of a font, and the data can be stored in the memory of an electronic device, the method comprising:

dividing the bit images that describe the character into a plurality of horizontal strips of vertical columns, where each horizontal strip and vertical column may contain both blank and non-blank bit images;

differentiating between horizontal strips that contain only blank bit images and horizontal strips that contain non-blank bit images;

establishing a signal to indicate which horizontal strips contain non-blank bit images;

disregarding the horizontal strips that contain only blank bit images;

differentiating, in the horizontal strips which contain non-blank bit images, between vertical columns that contain only blank bit images and vertical columns that contain non-blank bit images;

establishing, for the horizontal strips which contain non-blank bit images, a flag associated with each vertical column, where each flag indicates whether its respective vertical column contains non-blank bit images;

disregarding vertical columns where their associated flags indicate that the vertical columns contain only blank bit images; and storing in memory the signal to indicate which horizontal strips contain non-blank bit images, the flags which indicate whether their respective vertical columns contain non-blank bit images, and the bit images of the vertical column that contain non-blank bit images.

2. The method of claim 1, where the character has a horizontal black width, the method further comprising identifying the horizontal black width of the character, disregarding the bit images describing the character that are outside of the character's horizontal black width, and storing in memory the horizontal black width of the character instead of any flags identifying columns of bit images outside the character's horizontal black width.

3. The method of claim 1, where each vertical column is at least two bytes high and each flag includes at least two bits, one bit associated with a first byte of the flag's respective vertical column and another bit associated with a second byte of the flag's respective vertical column, and where the bits of each flag indicate whether their associated bytes contain non-blank bit images, the step of disregarding vertical columns includes disregarding bytes of vertical columns where their associated flag bits indicate that the bytes contain only blank bit images, and the step of storing the bit images of the vertical columns that contain non-blank bit images includes storing the bytes of the vertical columns that contain non-blank bit images.

4. The method of claim 1, where the step of storing further includes storing virtual characters at the ends of the bit images of the vertical columns that contain non-blank bit images, to identify the end of the bit images describing the character of the font, thereby allowing bidirectional printing.

5. The method of claim 1, where the step of dividing the bit images divides them into two horizontal strips, and where the signal indicating which horizontal strips contain non-blank bit images includes two bits, one bit associated with one horizontal strip and a second bit associated with a second horizontal strip, where each bit indicates whether its associated horizontal strip contains non-blank bit images.

6. A method of decompressing data describing a character of a font, where the data represents a plurality of horizontal strips of vertical columns of blank and non-blank bit images, and the data includes a signal indicating which horizontal strips of the character include non-blank bit images, and flags indicating which vertical columns of the strips that contain non-blank bit images also contain non-blank bit images, the method comprising:

reading the signal indicating which horizontal strips of the character include non-blank bit images;

reading the flags indicating which vertical columns in the horizontal strips that contain non-blank bit images also contain non-blank bit images; and compiling the character from the signal and from the blank and non-blank bit images indicated by the flags.

7. The method of claim 6, where the data further includes a horizontal width for the character, the step of reading includes reading the horizontal width, and the step of compiling includes using the horizontal width.

* * * * *